United States Patent
Joo et al.

(10) Patent No.: US 6,376,299 B1
(45) Date of Patent: Apr. 23, 2002

(54) CAPACITOR FOR SEMICONDUCTOR MEMORY DEVICE AND METHOD OF MANUFACTURING THE SAME

(75) Inventors: Kwang Chul Joo, Kyoungki-do; Kee Jeung Lee, Seoul; Il Keoun Han, Kyoungki-do, all of (KR)

(73) Assignee: Hyundai Electronics Industries, Co., Ltd., Kyoungki-do (KR)

( * ) Notice: Subject to any disclaimer, the term of this patent is extended or adjusted under 35 U.S.C. 154(b) by 0 days.

(21) Appl. No.: 09/608,098

(22) Filed: Jun. 30, 2000

(30) Foreign Application Priority Data

Jul. 2, 1999 (KR) .................................. 99-26510
Nov. 9, 1999 (KR) .................................. 99-49503

(51) Int. Cl.[7] .................................. H01L 21/8242
(52) U.S. Cl. .................. 438/240; 438/152; 438/253; 438/296; 438/396; 257/295
(58) Field of Search ................. 438/240, 152, 438/396, 253, 296; 257/295

(56) References Cited

U.S. PATENT DOCUMENTS

| | | | |
|---|---|---|---|
| 4,130,694 A | 12/1978 | Glass et al. | 429/321 |
| 5,352,623 A | 10/1994 | Kamiyama | 438/396 |
| 5,362,632 A | 11/1994 | Mathews | 438/152 |
| 5,438,012 A | 8/1995 | Kamiyama | 438/396 |
| 5,444,006 A * | 8/1995 | Han et al. | 437/60 |
| 5,452,178 A | 9/1995 | Emesh et al. | 361/303 |
| 5,631,188 A | 5/1997 | Chang et al. | 438/253 |
| 5,741,721 A | 4/1998 | Stevens | 438/396 |
| 5,753,945 A | 5/1998 | Chivukula et al. | 257/295 |
| 5,763,300 A | 6/1998 | Park et al. | 438/240 |
| 5,776,660 A | 7/1998 | Hakey et al. | 430/296 |
| 5,786,248 A | 7/1998 | Schuegraf | 438/240 |
| 5,837,576 A | 11/1998 | Chen et al. | 438/253 |
| 5,859,760 A | 1/1999 | Park et al. | 361/313 |
| 5,872,415 A | 2/1999 | Dreifus et al. | 310/311 |
| 5,910,880 A | 6/1999 | DeBoer et al. | 361/311 |
| 5,936,831 A | 8/1999 | Kola et al. | 361/303 |
| 5,939,131 A | 8/1999 | Kim et al. | 427/81 |
| 5,977,582 A | 11/1999 | Fleming et al. | 257/310 |
| 5,980,977 A | 11/1999 | Deng et al. | 438/79 |
| 5,981,331 A * | 11/1999 | Tsunemine | 438/240 |
| 6,150,183 A * | 11/2000 | Fukuda et al. | 438/3 |
| 6,207,489 B1 * | 3/2001 | Nam et al. | 438/240 |

FOREIGN PATENT DOCUMENTS

| | | |
|---|---|---|
| EP | 0 046 868 | 3/1982 |
| EP | 0 900 859 A2 | 3/1999 |
| GB | 2 320 131 A | 6/1998 |
| GB | 2 326 279 A | 12/1998 |
| GB | 2 344 218 A | 5/2000 |
| GB | 2 347 787 a | 9/2000 |
| JP | 62136035 | 6/1987 |
| JP | 63038248 | 2/1988 |
| JP | 01173622 | 7/1989 |
| JP | 02226754 | 9/1990 |
| JP | 05167008 | 7/1993 |
| JP | 05335483 | 12/1993 |
| JP | 06163819 | 6/1994 |
| JP | 07014993 | 1/1995 |
| JP | 07045467 | 2/1995 |
| JP | 11233723 | 8/1999 |
| JP | 11191612 | 7/2000 |
| WO | WO 99/33098 | 7/1999 |

* cited by examiner

*Primary Examiner*—Michael S. Lebentritt
*Assistant Examiner*—Pho Luu
(74) *Attorney, Agent, or Firm*—Pillsbury Winthrop LLP

(57) ABSTRACT

Disclosed are a capacitor for a semiconductor memory device and a method of manufacturing the same. According to the present invention, the method includes the steps of: forming a lower electrode on a semiconductor substrate; nitride-treating the surface of the lower electrode so as to prevent a natural oxide layer from generating on the surface thereof; forming a $Ta_2O_5$ layer as a dielectric layer on the upper part of the lower electrode; forming a conductive barrier made of the silicon nitride layer on the upper part of the $Ta_2O_5$ layer; and forming an upper electrode on the upper part of the conductive barrier.

24 Claims, 4 Drawing Sheets

CAPACITOR FOR SEMICONDUCTOR MEMORY DEVICE AND METHOD OF MANUFACTURING THE SAME

FIELD OF THE INVENTION

The present invention relates to a capacitor for semiconductor memory device and a method of manufacturing he same, and more particularly to a capacitor for semiconductor memory device including a conductive barrier having an excellent step coverage, between a dielectric layer and an upper electrode and a method of manufacturing the same.

BACKGROUND OF THE INVENTION

As the number of memory cells composing DRAM semiconductor device has been recently increased, occupancy area of each memory cell is gradually decreased. Meanwhile, capacitors formed in the respective memory cells require a sufficient capacitance for precise reading out of storage data. Accordingly, the current DRAM semiconductor device requires memory cells in which capacitors having larger capacitance as well as occupying small area are formed. The capacitance of a capacitor can be increased by using an insulator having high dielectric constant as a dielectric layer, or by enlarging the surface area of a lower electrode. In a highly integrated DRAM semiconductor device, a $Ta_2O_5$ layer having a higher dielectric constant than that of the nitride-oxide(NO) is now used as a dielectric, thereby forming a lower electrode of a 3-Dimentional structure.

FIG. 1 is a cross-sectional view showing a capacitor for a conventional semiconductor memory device. Referring to FIG. 1, a gate electrode 13 including a gate insulating layer 12 at a lower portion thereof is formed according to a known technique on the upper part of a semiconductor substrate 10 which a field oxide layer 11 is formed at a selected portion thereof. A junction region 14 is formed on the semiconductor substrate 10 at both sides of the gate electrode 13, thereby forming an MOS transistor. A first interlayer insulating layer 16 and a second interlayer insulating layer 18 are formed on the upper part of the semiconductor substrate 10 which the MOS transistor is formed therein. A storage node contact hole h is formed inside the first and the second interlayer insulating layers 16,18 so that the junction region 14 is exposed. A cylinder type lower electrode 20 is formed according to a known method, inside the storage node contact hole h so as to be in contact with the exposed junction region 14. A HSG(hemi-spherical grain) layer 21 is formed on a surface of a lower electrode 20 to increase the surface area of the lower electrode 20 more. A $Ta_2O_5$ layer 22 is deposited on the upper part of the lower electrode 20 which the HSG layer 21 is formed thereon. The $Ta_2O_5$ layer 22 can be formed according to PECVD(plasma enhanced chemical vapor deposition) method or LPCVD(low pressure chemical vapor deposition) method. At this time, the $Ta_2O_5$ formed according to the PECVD method has an advantage of excellent layer quality, but a disadvantage of poor step coverage property. Therefore, the conventional $Ta_2O_5$ layer 22 has been formed according to the LPCVD method having an excellent step coverage property. Afterwards, $Ta_2O_5$ layer 22 is crystallized after a selected thermal process. A titanium nitride layer(TiN) 23 serving as the conductive barrier is formed on the upper part of the $Ta_2O_5$ layer 22. The TiN layer 22 is formed according to the LPCVD method or a sputtering method. An upper electrode 24 made of a doped polysilicon layer is formed on the upper part of the TiN layer.

However, the capacitor using the $Ta_2O_5$ layer as a dielectric has the following problems.

First, a difference in the composition rate of Ta and O is generated since the $Ta_2O_5$ layer 23 generally has unstable stoichiometry. As a result, substitutional Ta atoms, i.e. vacancy atoms are generated in a thin film. Since those vacancy atoms are oxygen vacancies, leakage current is generated. The amount of vacancy atoms can be controlled depending on the contents and the bonding strength of components in the $Ta_2O_5$ layer; however, it is difficult to eliminate them completely. To stabilize the unstable stoichiometry of the $Ta_2O_5$ layer, the $Ta_2O_5$ layer is oxidized so as to remove the substitutional Ta atoms therein. However, when the $Ta_2O_5$ layer is oxidized to prevent leakage current, the following problem is generated. That is, the $Ta_2O_5$ layer has a large reaction with the lower electrode formed of a polysilicon layer. Therefore, in a oxidizing process of the substitutional Ta atoms, a natural oxide layer having low dielectric constant between the $Ta_2O_5$ layer and the lower electrode. Oxygen moves to an interface between the $Ta_2O_5$ layer and the lower electrode, thereby deteriorating the homogeneity of the interface.

Moreover, impurities such as carbon atoms (C), carbon compounds($CH_4$, $C_2H_4$), and $H_2O$ are generated inside the $Ta_2O_5$ layer by a reaction of organic substances of $Ta(OC_2H_5)_5$ used as a precursor and $O_2$ (or $N_2O$) gas. These impurities increase leakage current of a capacitor and deteriorate a dielectric property inside the $Ta_2O_5$ layer. Therefore, a great capacitor is difficult to obtain.

Meanwhile, the TiN layer 23 also serving as the conductive barrier between the upper electrode 24 and the $Ta_2O_5$ layer 22 has the following problems.

First, in case the TiN layer 23 serving as the conductive barrier is formed according to the LPCVD method, the problem is described. $TiCl_4$ gas and $NH_3$ gas are generally used for source gas of the TiN layer formed according to the LPCVD method. At this time, $TiCl_4$ gas has a property of being dissociated at a high temperature of more than 600° C. Therefore, the TiN layer is actually formed at much higher temperature than 600° C. to control easily Cl density therein. However, when forming the TiN layer, a high temperature process is accompanied, thereby generating mutual diffusion between atoms composing the $Ta_2O_5$ layer 22 and the lower electrode 20. And, a gas phase reaction is active in a chamber by $NH_4$ gas having a high reaction, thereby generating a large amount of particles inside the $Ta_2O_5$ layer or on the surface thereof. As a result, the homogeneity of the dielectric layer is deteriorated.

Furthermore, when the TiN layer is formed, the amount of Cl inside the TiN layer is difficult to be controlled. As a result, a large amount of Cl inside the TiN layer remain. The TiN layer which a large amount of Cl remained therein is difficult to serve as the conductive barrier, thereby generating leakage current inside the capacitor.

And, since the TiN layer 23 formed of according to the sputtering method has a poor step coverage property, the TiN layer is difficult to be deposited on the upper part of the $Ta_2O_5$ layer 22 to the thickness of 200 to 400 Å. As a result, voids are formed between the grains of the HSG layer 21, thereby deteriorating a capacitor property.

In addition, the TiN layer 23 and $Ta_2O_5$ layer 22 react at a temperature of 687 K (414° C.) as follows.

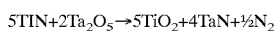

That is, in a range of 687 K temperature, the TiN layer 23 and the $Ta_2O_5$ layer 24 react, thereby generating undesired $TiO_2$ dielectric substances(not shown) on the interface between the TiN layer 23 and $Ta_2O_5$ layer 22. The $TiO_2$ dielectric substances increase the thickness of the dielectric layer, thereby deteriorating capacitance. In addition, $TiO_2$ itself has a high leakage property, thereby increasing leakage current of the dielectric layer.

SUMMARY OF THE INVENTION

Accordingly, it is an object of the present invention to improve the uniformity of the dielectric layer by preventing a natural oxide layer from generating between a lower electrode and a $Ta_2O_5$ layer.

And, it is another object of the present invention to ensure high capacitance as well as low leakage current.

It is the other object to form a conductive barrier having a good step coverage property.

To achieve the objects according to one aspect of the present invention, a capacitor for a semiconductor memory device includes: a lower electrode; a silicon nitride layer for restraint of a natural oxide layer formed on the lower electrode surface; a dielectric layer formed on the upper part of the silicon nitride layer; and an upper electrode formed on the upper part of the dielectric layer, wherein the dielectric layer is a $Ta_2O_5$ layer.

And, according to another embodiment, a capacitor for a semiconductor memory device includes: a lower electrode; a silicon nitride layer for restraint of a natural oxide layer formed on the lower electrode surface; a dielectric layer formed on the upper part of the silicon nitride layer; a conductive barrier made of the silicon nitride layer formed on the dielectric layer surface; and an upper electrode formed on the upper part of the conductive barrier, wherein the dielectric layer is a $Ta_2O_5$ layer.

Further, according to the other aspect a method for forming a capacitor for a semiconductor device includes the steps of: forming a lower electrode on the semiconductor substrate; nitride-treating the surface of the lower electrode; depositing the $Ta_2O_5$ layer as the dielectric layer on the upper part of the surface nitride-treated lower electrode; and forming an upper electrode on the upper part of the dielectric layer.

Moreover, according to another embodiment of the present invention the method of forming a capacitor for a semiconductor device including the steps of: forming a lower electrode on the semiconductor substrate; nitride-treating the surface of the lower electrode so as to prevent a natural oxide layer from generating on the surface thereof; forming a $Ta_2O_5$ layer as a dielectric layer on the upper part of the lower electrode; forming a conductive barrier made of the silicon nitride layer on the upper part of the $Ta_2O_5$ layer; and forming an upper electrode on the upper part of the conductive barrier.

And, according to the other embodiment a method of forming a capacitor for a semiconductor device includes the steps of: forming a lower electrode on the semiconductor substrate; nitride-treating the surface of the lower electrode inside a chamber maintaining $NH_3$ or $N_2/H_2$ plasma gas and a temperature of 200 to 700° C. so as to prevent a natural oxide layer from generating on the surface thereof; forming a $Ta_2O_5$ layer as a dielectric layer on the upper part of the lower electrode; crystallizing the $Ta_2O_5$ layer after thermal-treatment thereof; forming a conductive barrier made of the silicon nitride layer on the upper part of the $Ta_2O_5$ layer in a chamber maintaining plasma gas containing nitrogen and a temperature of 200 to 400° C.; and forming an upper electrode on the upper part of the conductive barrier, wherein the surface nitride treatment step of the lower electrode, the formation step of the $Ta_2O_5$ layer, the thermal-treating and then crystallizing step of the $Ta_2O_5$ layer and the formation step of the conductive barrier are performed in situ in the same chamber.

DETAILED DESCRIPTION OF THE PREFERRED EMBODIMENTS

[Embodiment 1]

Figure 1:
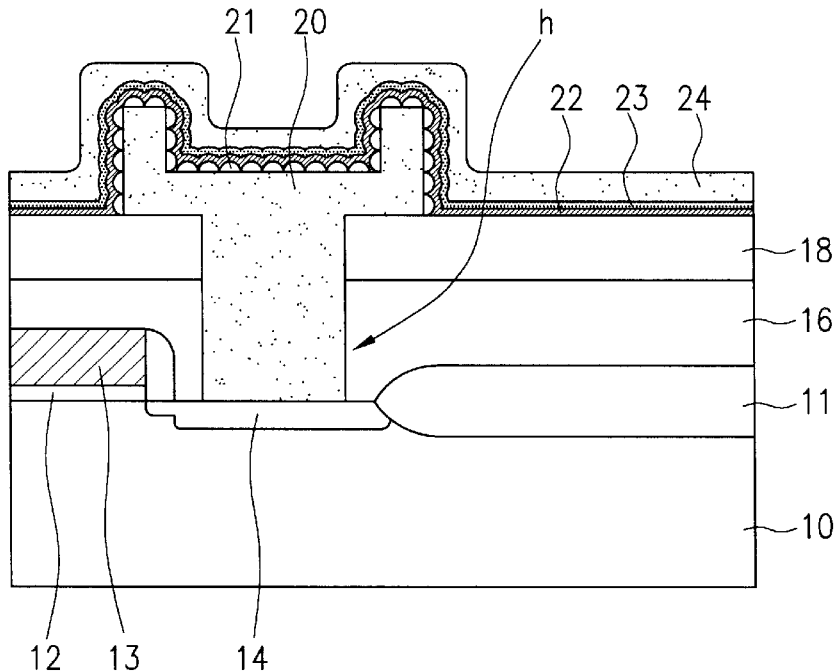
FIG. 1 is a cross-sectional view showing a conventional capacitor for a semiconductor memory device.
Figure 2A:
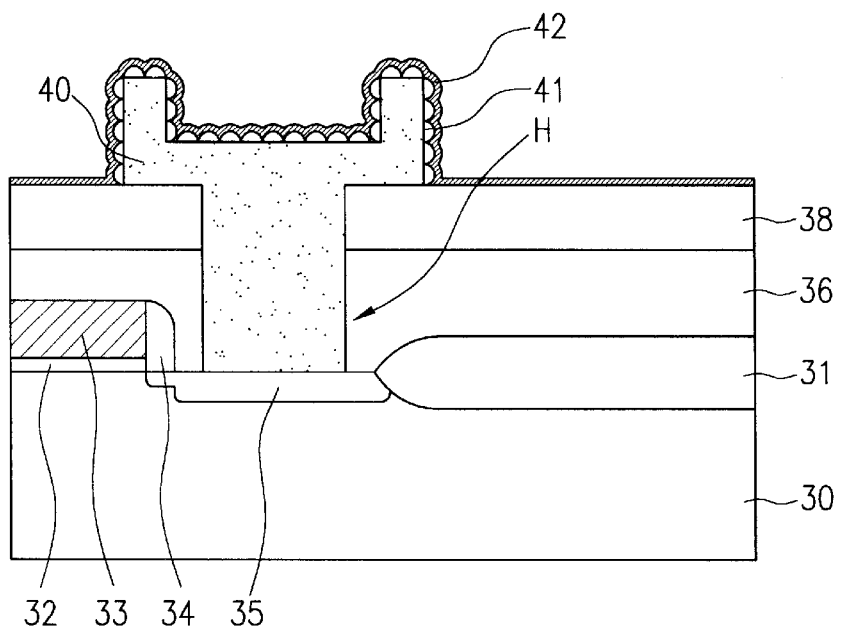
FIGS. 2A to 2D are cross-sectional views for describing a method of manufacturing a capacitor for a semiconductor device according to a first embodiment of the present invention.

Referring to FIG. 2A, a field oxide layer 31 is formed according to a known method at a selected portion of a semiconductor substrate 30 having a selected conductivity. A gate electrode 33 having a gate insulating layer 32 at a lower portion thereof is formed at a selected portion on the upper part of the semiconductor substrate 30, and a spacer 34 is formed according to a known method at both side-walls of the gate electrode 33. A junction region 35 is formed on the semiconductor substrate 30 at both sides of the gate electrode 33, thereby forming an MOS transistor. A first interlayer insulating layer 36 and a second interlayer insulating layer 38 are formed on the semiconductor substrate 30 which the MOS transistor is formed therein. Afterward, the second and the first interlayer insulating layers 38,36 are patterned so that a portion of the junction region 35 is exposed, thereby forming a storage node contact hole H. A lower electrode 40 of cylinder type is formed to be in contact with the exposed junction region 35. A HSG layer 41 for enlarging the surface area of the lower electrode 40 is formed according to a known method on the surface of the lower electrode 40.

Afterward, to restrain the generation of a low dielectric natural oxide layer at an interface between the lower electrode 40 having the HSG layer 41 and a dielectric layer to be formed later(not shown), the surfaces of the lower electrode 40 having the HSG layer 41 and the second interlayer insulating layer 38 are nitride-treated. The surface nitride-treatment is performed in an LPCVD chamber maintaining an $NH_3$ gas or $N_2/H_2$ gas plasma state at a temperature of 200 to 700° C., more preferably 300 to 500° C.

Figure 2B:
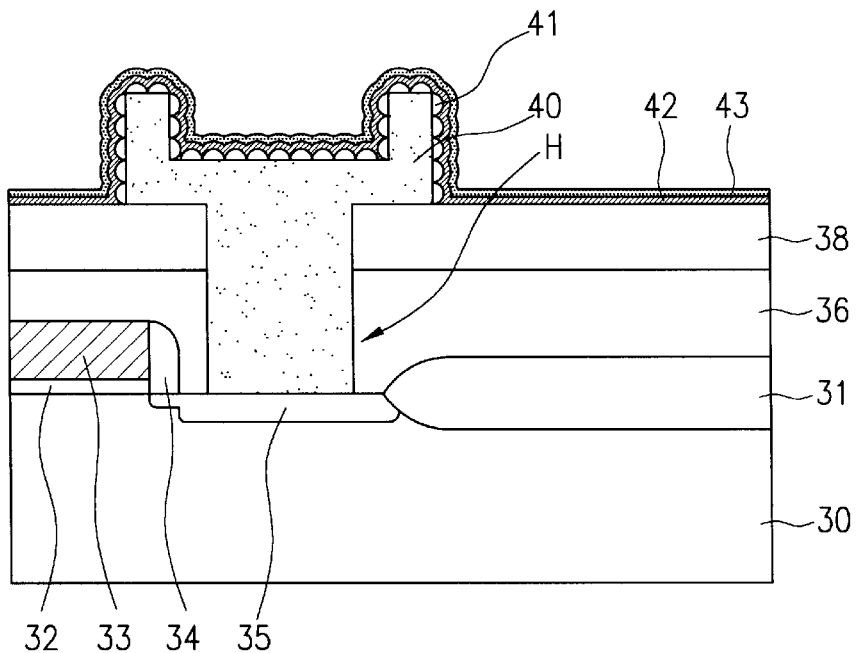

Referring to FIG. 2B, as a dielectric, a $Ta_2O_5$ layer 43 is formed on the surface of a first silicon nitride layer 42. The $Ta_2O_5$ layer 43 of the present invention is formed by a chemical gas phase deposition method, e.g. an LPCVD method and an organic material such as $Ta(OC_2H_5)_5$ (tantalum ethylate) is used as a precursor. Herein, the organic substance such as $Ta(OC_2H_5)_5$, as known, is in liquid state, and therefore is supplied into the LPCVD chamber after converting into a vapor state. That is, the precursor in liquid state is quantified using a flow controller such as an MFC(Mass Flow Controller) and then evaporated in an evaporizer including an orifice or a nozzle, or a conduit coupled to the chamber, thereby becoming Ta chemical vapor. Afterwards, Ta chemical vapor is preferably supplied into the LPCVD chamber by flux of 80 to 100 mg/min. At this time, the temperature of the evaporizer and a conduit coupled to the chamber which is a flow path of Ta vapor, is preferably maintained at 150 to 200° C. so as to prevent condensation of Ta chemical vapor. Ta chemical vapor supplied into the LPCVD chamber according to this method, and excess $O_2$ gas, reaction gas, are reacted together, thereby forming an amorphous $Ta_2O_5$ layer 43 to the thickness of approximately 100 to 150 Å. At this time, to minimize particle generation, Ta chemical vapor and $O_2$ gas are controlled to inhibit the gas phase reaction inside the chamber so that the gases react with each other only on the wafer surface. Herein, the gas phase reaction can be controlled by the flow rates of the reaction gases and the pressure within the chamber. And, according to the present embodiment, $O_2$ gas, reaction gas, is supplied into the LPCVD chamber by flux of 10 to 500 sccm or so and the temperature within the chamber is preferably maintained at 300 to 500° C. so as to restrain the gas phase reaction. At this time, the formation process of the $Ta_2O_5$ layer and the surface nitride-treatment process of the lower electrode are both performed in situ without interrupting the vacuum state within the LPCVD chamber. Consequently, an additional natural oxide and particle are not generated.

Afterwards, to remove chronic remaining substitutional Ta atoms within the $Ta_2O_5$ layer 43 and disconnected carbon components, the $Ta_2O_5$ layer 43 is first annealed under an atmosphere of $O_3$ or $UV-O_3$ at a temperature of 300 to 500° C. And then, to crystallize the $Ta_2O_5$ layer 43 and simultaneously remove carbon compounds remaining by a low temperature annealing process, a high annealing process is performed under an atmosphere of $N_2O$ gas, $O_2$ gas or $N_2$ gas at a temperature of 700 to 950° C. for 5 to 30 minutes. At this time, the annealing process with the surface nitride-treatment of the lower electrode and the formation process of the $Ta_2O_5$ layer is also performed in situ.

Figure 2C:
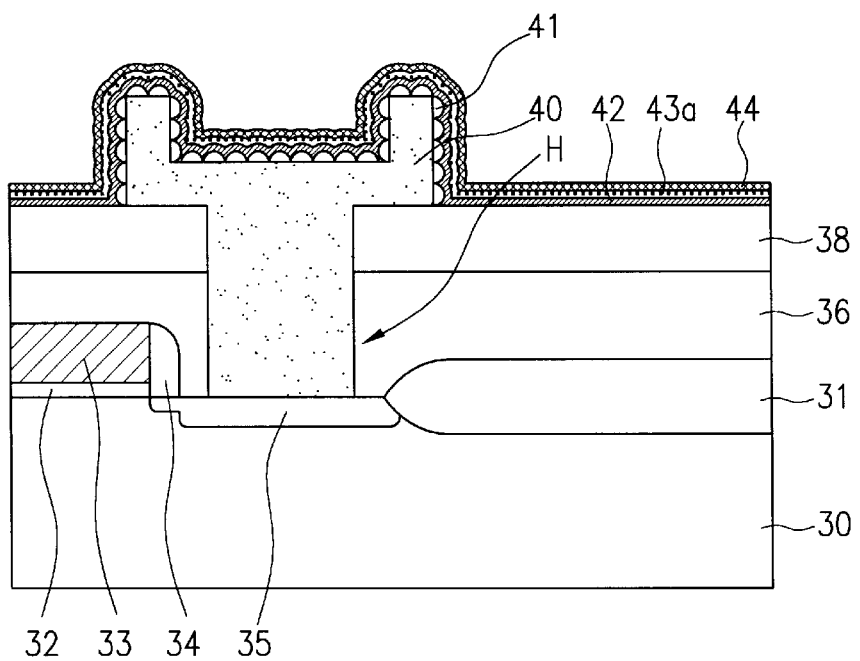

Afterwards, as shown in FIG. 2C, a second silicon nitride layer 44 as a conductive barrier is deposited on the upper part of the $Ta_2O_5$ layer 43. The second silicon nitride layer 44 is formed by a nitride-treatment using plasma, nitride-treatment using a furnace or an RTN method according to in-situ or cluster method. First, the nitride-treatment using plasma is performed under an atmosphere of $NH_3$ gas, $N_2/O_2$ gas, or $N_2O$ gas including containing nitrogen at a temperature of 200 to 400° C. Meanwhile, the nitride-treatment using the furnace and the RTN process are performed under an atmosphere of $NH_3$ gas, $N_2/O_2$ gas, or $N_2O$ gas at a temperature of 750 to 950° C. Herein, when the second silicon nitride layer 44 as a conductive barrier is formed by the nitride-treatment using plasma, it is performed in situ with the surface nitride-treatment process of the lower electrode, the formation process of the $Ta_2O_5$ layer and the annealing process of the $Ta_2O_5$ layer.

Figure 2D:
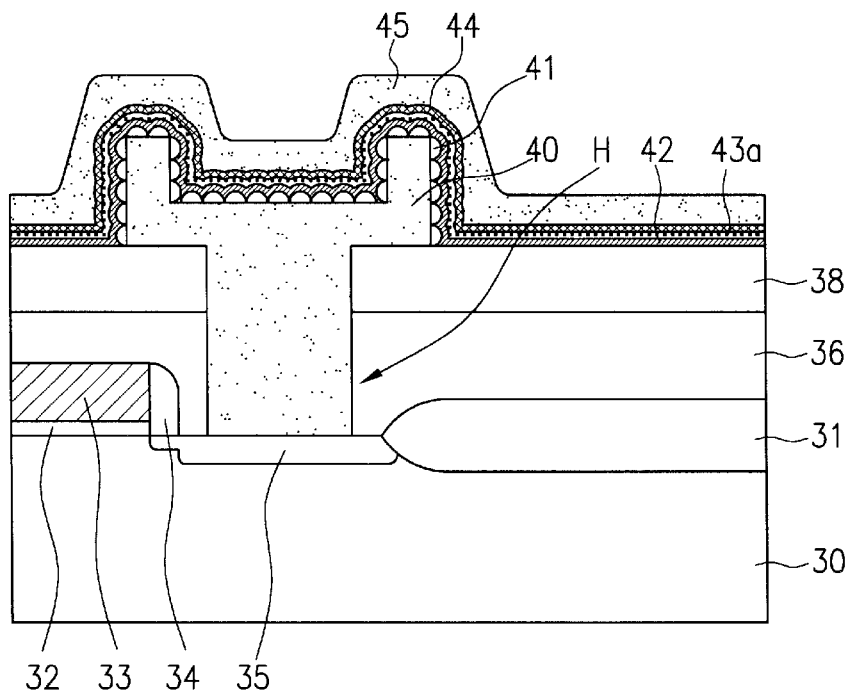

Next, referring to FIG. 2D, an upper electrode 45 is on the upper part of the second silicon nitride layer 44. The upper electrode 45 can be formed of a doped polysilicon layer and a metal layer such as TiN, TaN, W, WN, WSi, Ru, $RuO_2$, Ir, $IrO_2$ or Pt. When the doped polysilicon layer is used as the upper electrode 45, it is preferably deposited to the thickness of 1000 to 1500 Å. And, the metal layer is used as the upper electrode 45, it is preferably formed to the thickness of 100 to 600 Å. In addition, the polysilicon layer can be formed by a CVD method, the metal layer can be formed by one among LPCVD, PECVD, RF magnetic sputtering method.

According to the present embodiment, the $Ta_2O_5$ layer 43 is nitride-treated in situ before the formation thereof. As a result, in an oxidizing process for removing substitutional Ta atoms and impurities, oxide reaction of the lower electrode 40 and the $Ta_2O_5$ layer 43 is restrained, thereby reducing the movement of oxygen. Consequently, the equivalent thickness of the dielectric layer can be thinned, and the interface homogeneity between the lower electrode 40 and the $Ta_2O_5$ layer 43 can be ensured.

Moreover, the surface nitride-treatment process of the lower electrode, the formation process of the $Ta_2O_5$ layer, the thermal process of the $Ta_2O_5$ layer and the formation process of the silicon nitride layer for the conductive barrier are performed in situ, thereby preventing the generation of an additional natural oxidation and particles.

Further, the silicon nitride layer 44 as the conductive barrier is formed by plasma treatment under $NH_3$, gas, $N_2/O_2$ gas or $N_2O$ gas atmosphere, the nitride-treatment by the furnace, or the RTN process, and therefore can be homogeneously deposited to the thickness of 10 to 20 Å on the upper part of the $Ta_2O_5$ layer. Accordingly, the step coverage property of the conductive barrier is improved.

And, $TiCl_4$ source gas for the formation of a TiN layer is not required, and therefore the contamination within the chamber and the $Ta_2O_5$ layer 43 by Cl ion is prevented, thereby preventing leakage current. In addition, since the conductive barrier made of the silicon nitride layer is reacted with the $Ta_2O_5$ layer at a selected temperature, the generation of leakage current due to reaction byproducts and the problem of the increase in the effective thickness are not generated.

Furthermore, the $Ta_2O_5$ layer having high dielectric constant is used as the dielectric layer, thereby obtaining a capacitor having a high capacitance.

[EMBODIMENT 2]

Each part of the present embodiment may be largely equal to that of the first embodiment while only the structure of the lower electrode is different.

Figure 3:
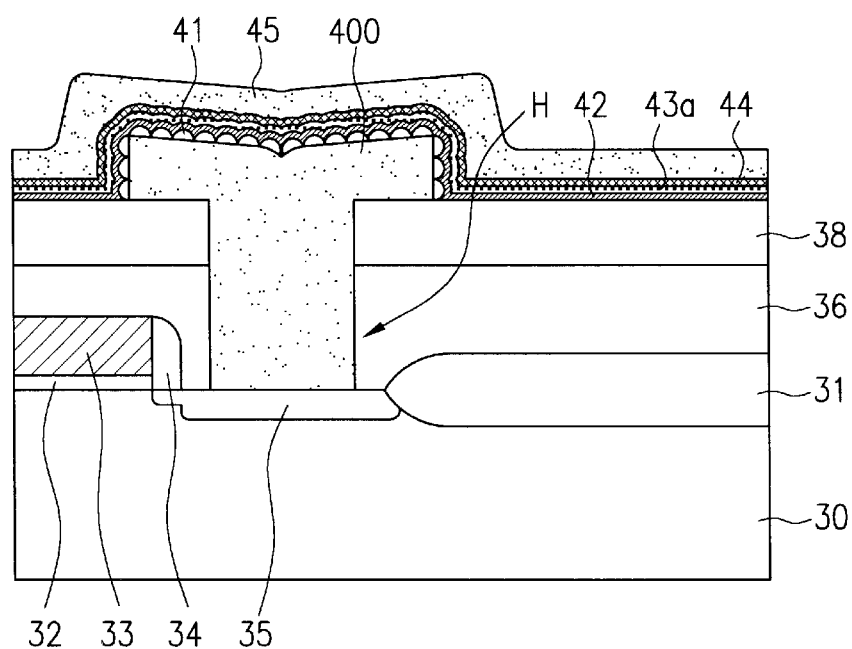
FIG. 3 is a cross-sectional view of a capacitor for a semiconductor memory device for describing a second embodiment of the present invention.

As shown in FIG. 3, according to the present embodiment, a lower electrode 400 is formed in a stack structure. Although the surface area of the stack structure lower electrode 400 is narrower than that of the cylinder structure lower electrode, the $Ta_2O_5$ layer having a good dielectric constant is used as the dielectric layer, thereby obtaining a desired capacitor.

[EMBODIMENT 3]

The present embodiment can be equal to the first and the second embodiments and only the manufacturing method thereof is different. And, all processes until the first silicon nitride layer 42 is formed, are equal to those of the first and the second embodiments, and therefore in the present embodiment, only the manufacturing method is described.

Figure 4A:
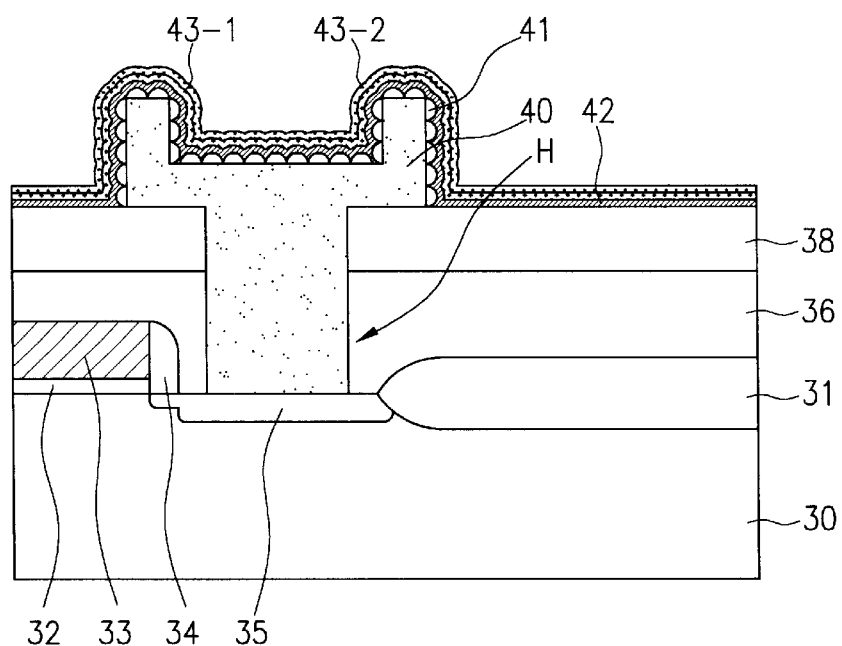
FIGS. 4A and 4B are cross-sectional views of a capacitor for a semiconductor memory device for describing a third embodiment of the present invention.

Referring FIG. 4A, a first $Ta_2O_5$ layer 43-1 is formed on the upper part of the first silicon oxide layer 42 to the thickness of 53 to 57 Å at a temperature of 400 to 450° C. Afterwards, the first $Ta_2O_5$ layer 43-1 is annealed in situ in an $N_2O$ or $O_2$ plasma state to remove substitutional Ta molecules and carbon components therein. Or, substitutional Ta molecules and carbon components inside the first $Ta_2O_5$ layer 43-1 can be removed ex situ using $UV-O_3$. Afterwards, a second $Ta_2O_5$ layer 43-2 is formed on the surface of the first annealed $Ta_2O_5$ layer 43-1 by the same methods as those of the formation of the first $Ta_2O_5$ layer 43-1.

Figure 4B:
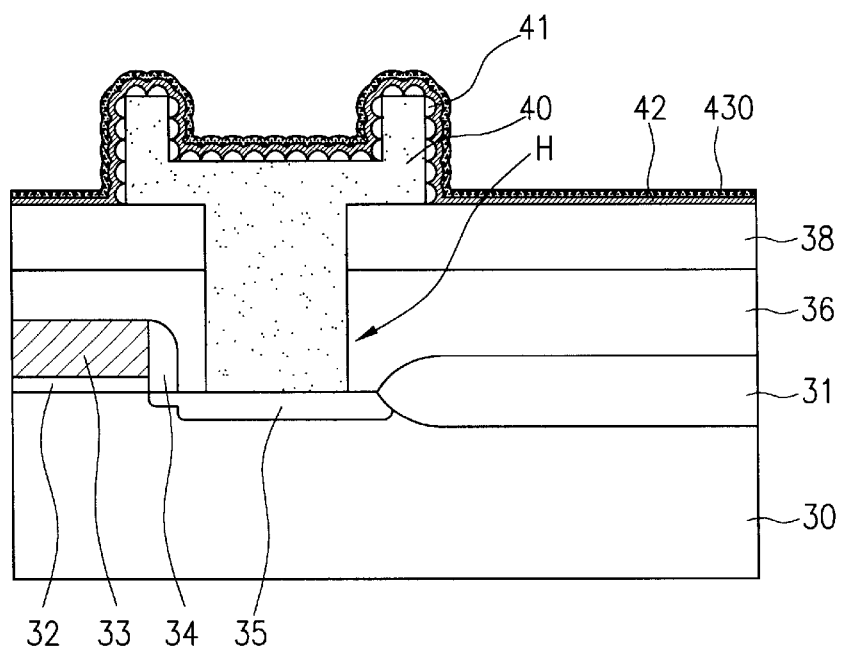

Next, as shown in FIG. 4B, the second $Ta_2O_5$ layer 43-2 and the first $Ta_2O_5$ layer 43-1 are annealed again so as to remove the substitutional Ta molecules and carbon components inside them. As a result, the first $Ta_2O_5$ layer 43-1 and the second $Ta_2O_5$ layer become single layers respectively due to this plasma annealing process.

As described above in detail, the followings are the effects of the present invention.

First, the $Ta_2O_5$ layer 43 is nitride-treated in situ before the formation thereof. Therefore, in an oxidizing process for removing substitutional Ta atoms and impurities. The oxide reaction of the lower electrode 40 and the $Ta_2O_5$ layer 43 is restrained and the movement of oxygen is reduced. Consequently, the equivalent thickness of the dielectric layer can be thinned, thereby ensuring the interface homogeneity between the lower electrode 40 and the $Ta_2O_5$ layer 43.

Moreover, those processes of the surface nitride-treatment of the lower electrode, the formation process of the $Ta_2O_5$ layer, the thermal process of the $Ta_2O_5$ layer and the formation process of the silicon nitride layer for the conductive barrier can be performed in situ, thereby preventing additional generation of natural oxidation and particles.

And, since the silicon nitride layer as a conductive barrier is formed by the plasma treatment or the RTN process under $NH_3$, $N_2/O_2$ or $N_2O$ gas atmosphere, the silicon nitride layer can be homogeneously deposited to the thickness of 10 to 20 Å although there is formed step difference on the upper part of the $Ta_2O_5$ layer. Accordingly, the step coverage property of the conductive barrier is improved.

Furthermore, since $TiCl_4$ source gas for forming of the TiN layer is not required, the contamination inside the chamber owing to the Cl ion is prevented, thereby preventing leakage current. In addition, since reaction between the conductive barrier made of the silicon nitride layer and the $Ta_2O_5$ layer is not generated at a selected temperature, leakage current by reaction byproducts and reaction byproducts are not generated. As a result, the effective thickness of the $Ta_2O_5$ layer is not increased.

And, the $Ta_2O_5$ layer is crystallized simultaneously with the formation of the conductive barrier, thereby reducing the manufacturing processes.

In addition, the $Ta_2O_5$ layer having a high dielectric constant is used as the dielectric layer, thereby obtaining a capacitor having a high capacitance.

Various other modifications will be apparent to and can be readily made by those skilled in the art without departing from the scope and spirit of the present invention.

What is claimed is:

1. A method of manufacturing a capacitor on a semiconductor substrate comprising the steps of:
    forming a lower electrode on the semiconductor substrate;
    nitride-treating the surface of the lower electrode;
    depositing the $Ta_2O_5$ layer as the dielectric layer on the upper part of the surface nitride-treated lower electrode; and
    forming an upper electrode on the upper part of the dielectric layer.

2. The method according to claim 1, the $Ta_2O_5$ layer is formed by surface-chemical-reacting Ta chemical vapor and $O_2$ gas inside a CVD chamber.

3. The method according to claim 1, the $Ta_2O_5$ layer is thermal-treated under an atmosphere of $O_3$ gas and $UV-O_3$ gas at a low temperature of 200 to 400° C. and at a high temperature of 750 to 950° C. between the formation step of the $Ta_2O_5$ layer and the formation step of the upper electrode.

4. The method according to claim 1, wherein the formation step of the $Ta_2O_5$ layer further comprises the steps of: forming a first $Ta_2O_5$ layer; first-thermal-treating the first $Ta_2O_5$ layer; forming a second $Ta_2O_5$ layer on the upper part of the thermal-treated first $Ta_2O_5$ layer; and second-thermal-treating the second $Ta_2O_5$ layer.

5. The method according to claim 4, wherein the first thermal-treatment step or the second thermal-treatment step is $N_2O$ or $O_2$ plasma treatment or $UV-O_3$ treatment.

6. The method according to claim 1, the surface nitride treatment of the lower electrode is performed in situ in a chamber maintaining a temperature of 200 to 700° C. and $NH_3$ or $N_2/H_2$ plasma gas atmosphere.

7. The method according to claim 1, further comprising a step of forming a conductive barrier made of the silicon nitride layer on the upper part thereof, between the formation step of the $Ta_2O_5$ layer and the formation step of the upper electrode.

8. The method according to claim 7, wherein the conductive barrier is formed under an atmosphere of plasma gas containing nitrogen at a temperature of 200 to 400° C.

9. The method according to claim 7, wherein the conductive barrier is formed in a furnace having an atmosphere of gas containing nitrogen components at a temperature of 750 to 950° C.

10. The method according to claim 7, wherein the conductive barrier is formed by RTN under an atmosphere of gas containing nitrogen components at a temperature of 750 to 950° C.

11. A method of manufacturing a capacitor on a semiconductor substrate comprising the steps of:
    forming a lower electrode on the semiconductor substrate;
    nitride-treating the surface of the lower electrode so as to prevent a natural oxide layer from generating on the surface thereof;
    forming a $Ta_2O_5$ layer as a dielectric layer on the upper part of the lower electrode;
    forming a conductive barrier made of the silicon nitride layer on the upper part of the $Ta_2O_5$ layer; and
    forming an upper electrode on the upper part of the conductive barrier.

12. The method according to claim 11, wherein the $Ta_2O_5$ layer is formed by surface-chemical-treating Ta chemical vapor and $O_2$ gas in a CVD chamber.

13. The method according to claim 11, wherein the $Ta_2O_5$ layer is thermal-treated under an atmosphere of $O_3$ gas and $UV-O_3$ gas at a low temperature of 200 to 400° C. and at a high temperature of 750 to 950° C. between the formation step of the $Ta_2O_5$ layer and the formation step of the conductive barrier.

14. The method according to claim 11, wherein the formation step of the $Ta_2O_5$ layer comprises the steps of: forming a first $Ta_2O_5$ layer; first-thermal-treating the first $Ta_2O_5$ layer; forming a second $Ta_2O_5$ layer on the upper part of the thermal-treated first $Ta_2O_5$ layer; and second-thermal-treating the second $Ta_2O_5$ layer.

15. The method according to claim 14, wherein the first thermal-treatment step or the second thermal-treatment step is $N_2O$ or $O_2$ plasma treatment or $UV-O_3$ treatment.

16. The method according to claim 11, wherein the surface nitride treatment of the lower electrode is performed in situ in a chamber maintaining atmosphere of $NH_3$ or $N_2/H_2$ plasma gas at a temperature of 200 to 700° C.

17. The method according to claim 11, wherein the conductive barrier is formed by a plasma treatment at temperature range of 200 to 400° C. by using a gas containing nitrogen.

18. The method according to claim 11, wherein the conductive barrier is formed inside a furnace having an atmosphere of gas containing nitrogen components in a temperature range of 750 to 950° C.

19. The method according to claim 11, wherein the conductive barrier is formed by RTN under an atmosphere of gas containing nitrogen components at a temperature of 750 to 950° C.

20. The method according to claim 11, wherein in the thermal $Ta_2O_5$ layer is thermal-treated under an atmosphere of $O_3$ gas and UV-$O_3$ gas at a low temperature of 200 to 400° C. and at a high temperature of 750 to 950° C.

21. A method of manufacturing a capacitor on a semiconductor substrate comprising the steps of:

forming a lower electrode on the semiconductor substrate;

nitride-treating the surface of the lower electrode inside a chamber maintaining $NH_3$ or $N_2/H_2$ plasma gas and a temperature of 200 to 700° C. so as to prevent a natural oxide layer from generating on the surface thereof;

forming a $Ta_2O_5$ layer as a dielectric layer on the upper part of the lower electrode;

crystallizing the $Ta_2O_5$ layer after thermal-treatment thereof;

forming a conductive barrier made of the silicon nitride layer on the upper part of the $Ta_2O_5$ layer in a chamber maintaining plasma gas containing nitrogen and a temperature of 200 to 400° C.; and forming an upper electrode on the upper part of the conductive barrier, wherein the surface nitride treatment step of the lower electrode, the formation step of the $Ta_2O_5$ layer, the thermal-treating and then crystallizing step of the $Ta_2O_5$ layer and the formation step of the conductive barrier are performed in situ in the same chamber.

22. The method according to claim 21, wherein the $Ta_2O_5$ layer is formed by surface-chemical-reacting Ta chemical vapor and $O_2$ gas inside a CVD chamber.

23. The method according to claim 21, wherein the formation step of the $Ta_2O_5$ layer comprises the steps of: forming a first $Ta_2O_5$ layer; first-thermal-treating the first $Ta_2O_5$ layer; forming a second $Ta_2O_5$ layer on the upper part of the thermal-treated first $Ta_2O_5$ layer; and second-thermal-treating the second $Ta_2O_5$ layer.

24. The method according to claim 23, wherein the first-thermal-treatment step or the second-thermal-treatment step is $N_2O$ or $O_2$ plasma treatment or UV-$O_3$ treatment.

* * * * *